(12) United States Patent
Wang et al.

(10) Patent No.: US 11,815,471 B2
(45) Date of Patent: *Nov. 14, 2023

(54) SYSTEMS AND METHODS FOR WAFER BOND MONITORING

(71) Applicant: Taiwan Semiconductor Manufacturing Co., Ltd., Hsinchu (TW)

(72) Inventors: Chih-Yu Wang, Taichung (TW); Hsi-Cheng Hsu, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/878,428

(22) Filed: Aug. 1, 2022

(65) Prior Publication Data

US 2022/0365001 A1 Nov. 17, 2022

Related U.S. Application Data

(62) Division of application No. 16/806,199, filed on Mar. 2, 2020, now Pat. No. 11,543,363.

(60) Provisional application No. 62/852,759, filed on May 24, 2019.

(51) Int. Cl.
*G01N 21/95* (2006.01)
*H01L 21/50* (2006.01)
*H01L 21/66* (2006.01)
*H01L 21/60* (2006.01)

(52) U.S. Cl.
CPC ......... *G01N 21/9505* (2013.01); *H01L 21/50* (2013.01); *H01L 22/12* (2013.01); *H01L 2021/60112* (2013.01); *H01L 2021/60292* (2013.01)

(58) Field of Classification Search
None
See application file for complete search history.

(56) References Cited

U.S. PATENT DOCUMENTS

| | | | |
|---|---|---|---|
| 5,892,286 | A | 4/1999 | Toyoda et al. |
| 11,543,363 | B2 * | 1/2023 | Wang ............... H01L 21/67253 |
| 2003/0047710 | A1 | 3/2003 | Babu et al. |
| 2006/0273372 | A1 | 12/2006 | Voldman et al. |
| 2011/0217795 | A1 | 9/2011 | Tanida et al. |
| 2013/0236088 | A1 | 9/2013 | Umehara et al. |
| 2014/0131883 | A1 | 5/2014 | Huang et al. |
| 2016/0079199 | A1 | 3/2016 | Seok et al. |
| 2017/0229562 | A1 | 8/2017 | Katou |

(Continued)

FOREIGN PATENT DOCUMENTS

| CN | 101711354 A | 5/2010 |
|---|---|---|
| JP | H09312317 A | 12/1997 |

(Continued)

*Primary Examiner* — Alexander G Ghyka
(74) *Attorney, Agent, or Firm* — Seed IP Law Group LLP

(57) ABSTRACT

Systems and methods are provided for monitoring wafer bonding and for detecting or determining defects in a wafer bond formed between two semiconductor wafers. A wafer bonding system includes a camera configured to monitor bonding between two semiconductor wafers. Wafer bonding defect detection circuitry receives video data from the camera, and detects a bonding defect based on the received video data.

20 Claims, 6 Drawing Sheets

(56) References Cited

U.S. PATENT DOCUMENTS

| | | |
|---|---|---|
| 2018/0370210 A1 | 12/2018 | Kim et al. |
| 2019/0198444 A1 | 6/2019 | Amanapu et al. |
| 2020/0040221 A1 | 2/2020 | Chih et al. |
| 2020/0190247 A1 | 6/2020 | Oshita et al. |

FOREIGN PATENT DOCUMENTS

| | | |
|---|---|---|
| JP | 2011205074 A | 10/2011 |
| KR | 95-0021363 U | 7/1995 |
| KR | 0108386 Y1 | 10/1997 |
| KR | 20130102486 A | 9/2013 |
| KR | 20160032594 A | 3/2016 |
| TW | 201625936 A | 7/2016 |
| WO | 9960607 A2 | 11/1999 |

* cited by examiner

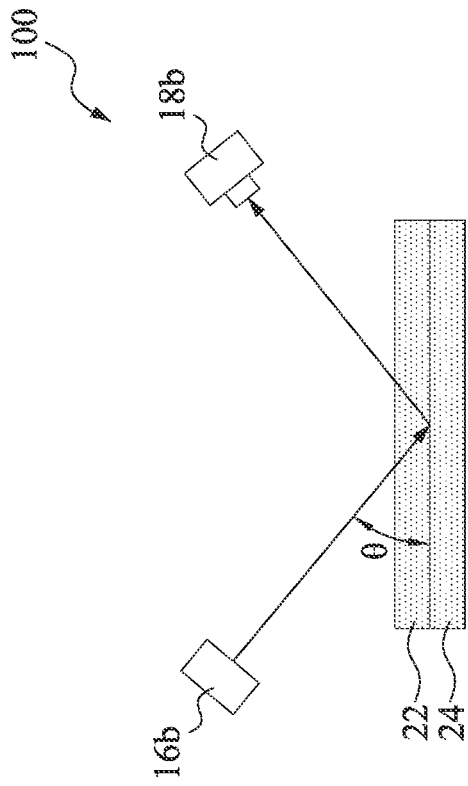
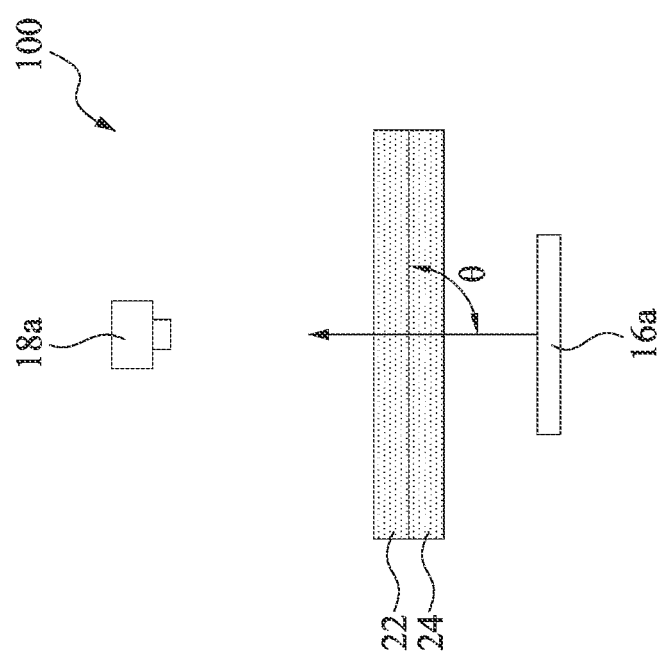

SYSTEMS AND METHODS FOR WAFER BOND MONITORING

PRIORITY CLAIM AND CROSS-REFERENCE

This application claims priority to U.S. application Ser. No. 16/806,199, filed Mar. 2, 2020, which claims the benefit of U.S. Provisional Patent Application No. 62/852,759, filed May 24, 2019, which is incorporated by reference herein in its entirety.

BACKGROUND

Wafer bonding, such as fusion wafer bonding, is a process in which semiconductor wafers may be bonded to each other. Typically, a quality or state of the bonding can be detected only after the bonding has been completed, and in some cases, only after bonding of an entire batch of wafers has been performed. Thus, in a case where one or more bonding defects are present due to process conditions, for example, a pressure within the wafer bonding chamber, pressure applied to bond the wafers, pre-bonding processes, or the like, the bonding defects may not be determined until after many wafers have been bonded. This may result in expenditure of significant time and cost to mitigate the damage caused by the improper bonding or the bonding defects, and in some cases, this may result in scrapping of the improperly bonded wafers.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a diagram schematically illustrating a transparent-type configuration of a wafer bonding apparatus, in accordance with some embodiments.

FIG. 2B is a diagram schematically illustrating a reflective-type configuration of a wafer bonding apparatus, in accordance with some embodiments.

DETAILED DESCRIPTION

Figure 1:
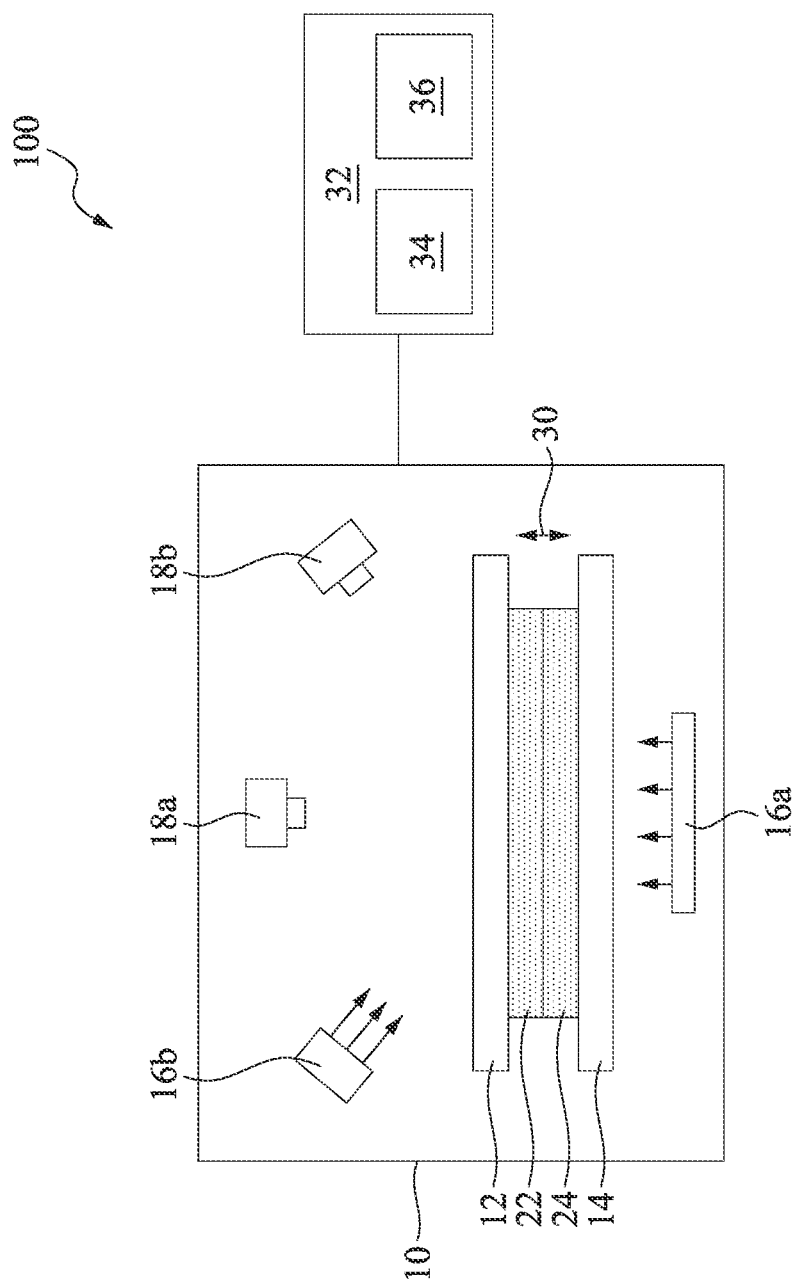
FIG. 1 is a block diagram schematically illustrating a wafer bonding apparatus, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, the present disclosure provides systems, apparatuses, and methods in which wafer bonding may be monitored, in real-time, to observe bonding wave propagation as the wafers are bonded to one another. Embodiments provided herein include systems and methods for determining the presence of bonding defects during bonding of semiconductor wafers based on video data that is acquired of the bonding of the wafers. In some embodiments, machine learning techniques are utilized to analyze the acquired video data, and the analysis may be based at least in part on historical or past video data of bonding of semiconductor wafers that is stored in a bonding defect database.

FIG. 1 is a block diagram schematically illustrating a wafer bonding apparatus 100, in accordance with one or more embodiments of the present disclosure.

As shown in FIG. 1, the wafer bonding apparatus 100 includes a wafer bonding chamber 10 in which a first wafer chuck 12 and a second wafer chuck 14 are positioned opposite one another, for example, facing each other. In various embodiments, the first wafer chuck 12 and the second wafer chuck 14 may be used to bond a first semiconductor wafer 22 to a second semiconductor wafer 24. The wafer bonding chamber 10 may be a chamber within which bonding of the first and second semiconductor wafers 22, 24 is performed.

The first and second wafer chucks 12, 14 may be configured to respectively hold or carry the first and second semiconductor wafers 22, 24 so that the semiconductor wafers 22, 24 may be brought into contact and bonded with one another in the wafer bonding apparatus 100. In various embodiments, the first and second wafer chucks 12, 14 may include any features or functionalities of known wafer chucks for semiconductor wafer bonding. In some embodiments, the first and second wafer chucks 12, 14 may have one or more openings (for example, at a contact surface at which the wafer chucks 12, 14 contact the semiconductor wafers 22, 24) through which a vacuum pressure may be applied to hold the semiconductor wafers 22, 24 to the first and second wafer chucks 12, 14 by suction. In other embodiments, the first and second semiconductor wafers 22, 24 may be respectively held by the first and second wafer chucks 12, 14 by mechanical interaction, such as by one or more clamps, retaining rings, or the like which may apply a mechanical holding force to the semiconductor wafers 22, 24, thereby holding the semiconductor wafers 22, 24 in a desired position by the first and second wafer chucks 12, 14.

In various embodiments, the first and second wafer chucks 12, 14 may include silicon based materials, such as glass, silicon oxide, silicon nitride, or other materials, such as aluminum oxide, combinations of any of these materials, or the like. The first wafer chuck 12 may have a diameter that is suitable to hold the first semiconductor wafer 22, and the second wafer chuck 14 may have a diameter that is suitable to hold the second semiconductor wafer 14. The diameters of the first and second wafer chucks 12, 14 may be selected, and may vary, based on a diameter of the first and second semiconductor wafers 22, 24, respectively. In some embodiments, the diameters of the first and second wafer chucks 12, 14 may be the same or substantially the same, while in other embodiments, the first and second wafer chucks 12, 14 may have different diameters, sizes, or the like. For example, where the first and second semiconductor wafers 22, 24 have different sizes (e.g., different diameters), the first and second wafer chucks 12, 14 may similarly have different sizes (e.g., different diameters) to accommodate the first and second wafers 22, 24.

During performance of wafer bonding by the wafer bonding apparatus 100, the first and second semiconductor wafers 22, 24 are brought into contact with one another, for example, by motion of the first and second wafer chucks 12, 14 toward one another, as illustrated by the double arrow 30. In various embodiments, one of the first and second wafer chucks 12, 14 may be movable with respect to the other of the first and second wafer chucks 12, 14, and in some embodiments, both of the first and second wafer chucks 12, 14 are movable toward one another.

In some embodiments, the wafer bonding apparatus 100 includes a controller or control circuitry 32 that controls one or more operations of the wafer bonding apparatus 100. For example, in various embodiments, the controller 32 may control forces or pressures applied to the semiconductor wafers 22, 24 during bonding, e.g., by control of the first and second wafer chucks 12, 14 to bring them toward one another and to press the first and second semiconductor wafers 22, 24 together during bonding. In various embodiments, the controller 32 may control other wafer bonding parameters, such as a pressure within the wafer bonding chamber 10, a vacuum pressure or mechanical pressure applied by the first and second wafer chucks 12, 14 to hold the first and second semiconductor wafers 22, 24, heating or other environmental parameters of the wafer bonding chamber 10, or the like.

The controller 32 may include a processor 34 and a computer-readable memory 36. The memory 36 may include machine readable instructions that when executed by the processor 34, cause the controller 32 to send command signals to one or more components of the wafer bonding apparatus 100, such as the first and second wafer chucks 12, 14, vacuum or pressure mechanisms, heating mechanisms, or the like. In some embodiments, the controller 32 may control operations of the light sources 16a, 16b and the cameras 18a, 18b. For example, the controller 32 may control emission of light by the light sources 16a, 16b, and may control imaging by the cameras 18a, 18b, for example, by turning on and off the light sources 16a, 16b and the cameras 18a, 18b.

The wafer bonding apparatus 100 further includes one or more light sources 16a, 16b and one or more cameras 18a, 18b. The one or more cameras 18a, 18b are positioned to monitor the bonding of the first and second semiconductor wafers 22, 24 in the wafer bonding apparatus 100. The cameras 18a, 18b may be video cameras which acquire real-time video data of the bonding process as the bonding process occurs. In some embodiments, the cameras 18a, 18b may be infrared (IR) video cameras configured to acquire video images using light in the infrared spectrum (which may include, for example, light in the near-infrared, mid-infrared, and far-infrared wavelengths). However, embodiments of the present disclosure are not limited thereto, and in various embodiments, the cameras 18a, 18b may be configured to acquire video images using light of any wavelengths, including, for example, light within the visible spectrum, ultraviolet spectrum, or any other wavelengths of light.

In some embodiments, the one or more light sources 16a, 16b emit light having wavelengths within a range from about 0.7 μm to about 1 μm, which includes Near-Infrared, Mid-Infrared, and Far-Infrared wavelengths. In some embodiments, the light sources 16a, 16b emit white light (or visible light) as well as light in the IR spectrum.

The one or more light sources 16a, 16b emit light toward the semiconductor wafers 22, 24 during bonding of the semiconductor wafers 22, 24 in the wafer bonding apparatus 100. In some embodiments, the light emitted by the light sources 16a, 16b may be transmitted through the first and second semiconductor wafers 22, 24 and received by one or more cameras 18a, 18b, and in some embodiments, the light emitted by the light sources 16a, 16b may be reflected by the first or second semiconductor wafers 22, 24 and received by one or more cameras 18a, 18b. This will be described in further detail with reference to FIGS. 2A and 2B. It will be readily appreciated that while FIG. 1 illustrates two light sources 16a, 16b and two cameras 18a, 18b, in various embodiments, more or fewer than two light sources and cameras may be included in the wafer bonding apparatus 100. For example, in some embodiments, a single light source 16a is configured to transmit light through the semiconductor wafers 22, 24, and the light may be received by a single camera 18a. In other embodiments, a single light source 16b may be configured to transmit light that is reflected by one or both of the semiconductor wafers 22, 24 and the reflected light is received by a single camera 18b.

In some embodiments, the first and second wafer chucks 12, 14 are at least partially transparent to the light emitted by the light sources 16a, 16b so that light may be transmitted through the wafer chucks 12, 14 and at least partially into, and in some embodiments through, the first and second semiconductor wafers 22, 24.

FIG. 2A schematically illustrates a transparent-type configuration of the wafer bonding apparatus 100 in which the first and second semiconductor wafers 22, 24 are positioned between the light source 16a and the camera 18a during bonding of the first and second semiconductor wafers 22, 24. The light source 16a is positioned at one side of the wafers 22, 24 and is configured to transmit light through both the first and second semiconductor wafers 22, 24, and the camera 18a is positioned at the opposite side of the wafers 22, 24 and is configured to receive the light after it passes through both the first and second semiconductor wafers 22, 24. In this way, the camera 18a may monitor a bonding wave as the first and second semiconductor wafers 22, 24 are bonded together, through imaging of the first and second semiconductor wafers 22, 24 during bonding while the light (e.g., IR light) is transmitted through the first and second semiconductor wafers 22, 24.

As shown in FIG. 2A, the light emitted by the light source 16a may have an incidence angle θ at the bonding interface between the first and second semiconductor wafers 22, 24, measured with respect to a plane of the bonding interface (e.g., measured with respect to the horizontal direction, as shown). The incidence angle θ may be any suitable angle for transmission of the light through the first and second semiconductor wafers 22, 24. In some embodiments, the incidence angle θ is within a range from 90° to 180°. In some embodiments, the camera 18a is positioned directly across from the light source 16a, e.g., with the camera 18a aligned with an emission axis along which the light emitted from the light source 16a travels; however, embodiments of the present disclosure are not limited thereto, and in some embodiments, the camera 18a may be positioned such that it is not aligned with the emission axis of the light source 16a.

FIG. 2B schematically illustrates a reflective-type configuration of the wafer bonding apparatus 100 in which the light source 16b and the camera 18b are positioned on a same side with respect to the first and second semiconductor wafers 22, 24 (e.g., above or below the wafers) during bonding of the first and second semiconductor wafers 22, 24. The light source 16b is positioned at one side of the wafers 22, 24 and is configured to transmit light toward the first semiconductor wafer 22. The light transmitted by the light source 16b is reflected by one or both of the first and second semiconductor wafers 22, 24 and is received by the camera 18b which is positioned at the same side of the wafers 22, 24 as the light source 16b. The light may be reflected by any surface of the first or second semiconductor wafers 22, 24, and in some embodiments, the light is reflected at or near the interface at which the first and second semiconductor wafers 22, 24 are bonded to one another.

In this way, the camera 18b may monitor a bonding wave as the first and second semiconductor wafers 22, 24 are bonded together, through imaging of the first and second semiconductor wafers 22, 24 during bonding while the light (e.g., IR light) is transmitted at least partially into the first semiconductor wafer 22, 24 and is reflected at or near the bonding interface of the first and second semiconductor wafers 22, 24 and is received by the camera 18b.

As shown in FIG. 2B, the light emitted by the light source 16b may have an incidence angle θ at the bonding interface between the first and second semiconductor wafers 22, 24, measured with respect to a plane of the bonding interface (e.g., measured with respect to the horizontal direction, as shown). The incidence angle θ may be any suitable angle for transmission of the light at least partially into the first semiconductor wafer 22 and reflection of the light at or near the bonding interface of the first and second semiconductor wafers 22, 24. In some embodiments, the incidence angle θ is within a range from 0° to 90°, and in some embodiments, the incidence angle θ is within a range from 30° to 60°. In some embodiments, the camera 18b is positioned at an angle with respect to the plane of the bonding interface that is the same or substantially the same as the incidence angle θ; however, embodiments of the present disclosure are not limited thereto, and in some embodiments, the camera 18b may be positioned at any angle with respect to the bonding interface suitable for receiving the reflected light.

While the first and second wafer chucks 12, 14 are not shown in the wafer bonding apparatus 100 shown in FIGS. 2A and 2B, it will be readily appreciated that the first and second wafer chucks 12, 14, as well as any other components, features or the like of wafer bonding apparatuses, tools or systems which may be known to those skilled in the art, may be included in the apparatus 100. The first and second wafer chucks 12, 14, in some embodiments, may be at least partially transparent so that the light emitted by the light source 16a may pass through one or both of the first and second wafer chucks 12, 14, and in other embodiments, one or both of the first and second wafer chucks 12, 14 may have openings through which the light transmitted by the light source 16a, 16b passes (e.g., the first and second wafer chucks 12, 14 may hold the wafers 22, 24 at their edges so that the wafers 22, 24 are exposed to the light emitted by the light source 16a, 16b through the openings in the first and second wafer chucks 12, 14).

Referring again to FIG. 1, the wafer bonding apparatus 100 may include any number of light sources 16a, 16b and any number of cameras 18a, 18b. For example, in some embodiments, the wafer bonding apparatus 100 may have a configuration that is a combination of the transparent-type and the reflective-type, e.g., with a first camera 18a positioned opposite a first light source 16a and configured to receive light that is transmitted through the first and second semiconductor wafers 22, 24, and a second camera 18b positioned on a same side as a second light source 16b and configured to receive light that is reflected by the first and second semiconductor wafers 22, 24.

In some embodiments, the wafer bonding apparatus 100 may include a plurality of cameras 18a, 18b, each of which may be positioned at a different position, orientation, or angle with respect to the semiconductor wafers being bonded. In some embodiments, using multiple cameras, the wafer bonding apparatus 100 may construct a 3D image of the bonding of the wafers.

The wafer bonding apparatus 100 may be configured to monitor bonding between semiconductor wafers having a plurality of different materials, e.g., at the interface between the first and second semiconductor wafers 22, 24. For example, in various embodiments, the wafer bonding apparatus 100 may be configured to monitor bonding of semiconductor wafers having as a bonding surface any of a thermal oxidation layer, a poly-silicon layer, silicon nitride, silicon oxide, or any other material. Moreover, the wafers being bonded to one another (e.g., the first and second semiconductor wafers 22, 24) may be semiconductor wafers that are at any stage of processing. For example, in various embodiments, the semiconductor wafers may be unpatterned wafers (which may be referred to herein as "dummy wafers"), which may be semiconductor wafers that have not yet been patterned or otherwise processed to form, for example, electrical features such as metal or conductive layers, polysilicon layers, or the like. In some embodiments, the unpatterned or dummy wafers may include an unpatterned material at the bonding surface, such as an unpatterned layer of an oxide or the like. In some embodiments, the semiconductor wafers may be patterned wafers, which may be semiconductor wafers which have been patterned or otherwise processed to form any of a variety of electrical features, including for example, patterned metal or conductive layers, polysilicon layers, or the like.

The semiconductor wafers that are bonded to one another in the wafer bonding apparatus 100, such as the first and second semiconductor wafers 22, 24, may be wafers of any semiconductor material. In various embodiments, the first and second semiconductor wafers 22, 24 may be monocrystalline silicon (Si) wafers, amorphous Si wafers, gallium arsenide (GaAs) wafers, or any other semiconductor wafers.

Figure 3A:
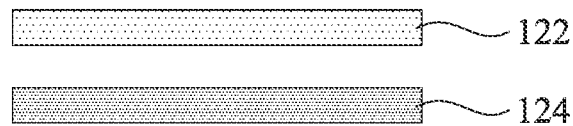
FIGS. 3A to 3C are views schematically illustrating different types of semiconductor wafers which may be bonded to one another in the wafer bonding apparatus shown in FIG. 1, in accordance with some embodiments.
Figure 3B:
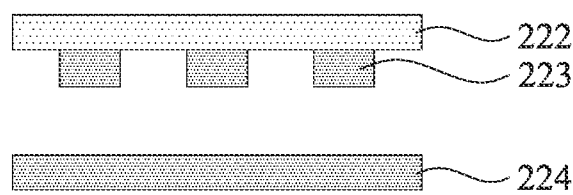
Figure 3C:
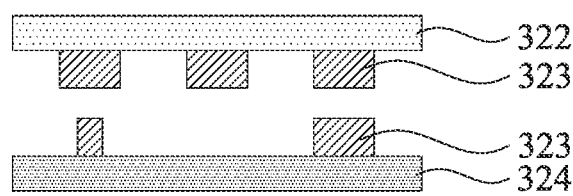

FIGS. 3A to 3C are views schematically illustrating different types of semiconductor wafers which may be bonded to one another, for example, in the wafer bonding apparatus 100 shown in FIG. 1.

FIG. 3A illustrates an example in which a first semiconductor wafer 122 is bonded to a second semiconductor wafer 124, for example, by the wafer bonding apparatus 100. In the example of FIG. 3A, both the first and second semiconductor wafers 122, 124 are dummy wafers. The wafer bonding apparatus 100 may be utilized to bond the first and second semiconductor wafers 122, 124 to one another, and the bonding interface between the first and second semiconductor wafers 122, 124 may be free of patterned features, as both of the first and second semiconductor wafers 122, 124 are dummy wafers. The bonding surfaces of the first and second semiconductor wafers 122, 124 may be, in various embodiments, a thermal oxidation layer, silicon nitride, silicon oxide, or any other unpatterned material.

FIG. 3B illustrates an example in which a first semiconductor wafer 222 is bonded to a second semiconductor wafer 224, for example, by the wafer bonding apparatus 100. In the example of FIG. 3B, the first semiconductor wafer 222 is a patterned wafer, while the second semiconductor wafer 224 is a dummy wafer. The first semiconductor wafer 222 may include a plurality of patterned features 223 at the bonding surface, e.g., the surface which is bonded to the second semiconductor wafer 222. The patterned features 223 may be, for example, patterned electrical features, including for example, patterned metal or conductive layers, polysilicon layers, or the like.

The wafer bonding apparatus 100 may be utilized to bond the first and second semiconductor wafers 222, 224 to one another, and the bonding interface between the first and second semiconductor wafers 222, 224 include patterned features at one side (e.g., at the bonding surface of the first semiconductor wafer 222) and may be free of patterned features at the other side (e.g., at the bonding surface of the second semiconductor wafer 224). The bonding surface of the second semiconductor wafer 224 may be, in various embodiments, a thermal oxidation layer, silicon nitride, silicon oxide, or any other unpatterned material.

While the patterned wafer (i.e., the first semiconductor wafer 222) is shown in FIG. 3B as being disposed over the dummy wafer (i.e., the second semiconductor wafer 224), it will be readily appreciated that in various embodiments the patterned wafer may be disposed below the dummy wafer.

FIG. 3C illustrates an example in which two patterned semiconductor wafers, e.g., a first semiconductor wafer 322 and a second semiconductor wafer 324, are bonded to one another, for example, by the wafer bonding apparatus 100. In the example of FIG. 3C, both the first and second semiconductor wafers 322, 324 are patterned wafers, each of which may include, for example, a plurality of patterned features 323 at the bonding surface, e.g., the surfaces of the first and second semiconductor wafers 322, 324 that are bonded together. The patterned features 323 may be, for example, patterned electrical features, including for example, patterned metal or conductive layers, polysilicon layers, or the like.

The wafer bonding apparatus 100 shown in FIG. 1 monitors the bonding of the first and second semiconductor wafers 22, 24, which may be dummy wafers, patterned wafers, or one dummy wafer and one patterned wafer, as shown and described in the examples of FIGS. 3A to 3C. During bonding of the semiconductor wafers 22, 24, the one or more cameras 18a, 18b monitor the bonding state of the wafers, such as by monitoring propagation of a bonding wave and monitoring unbonded regions or defect regions during the bonding.

Figure 4:
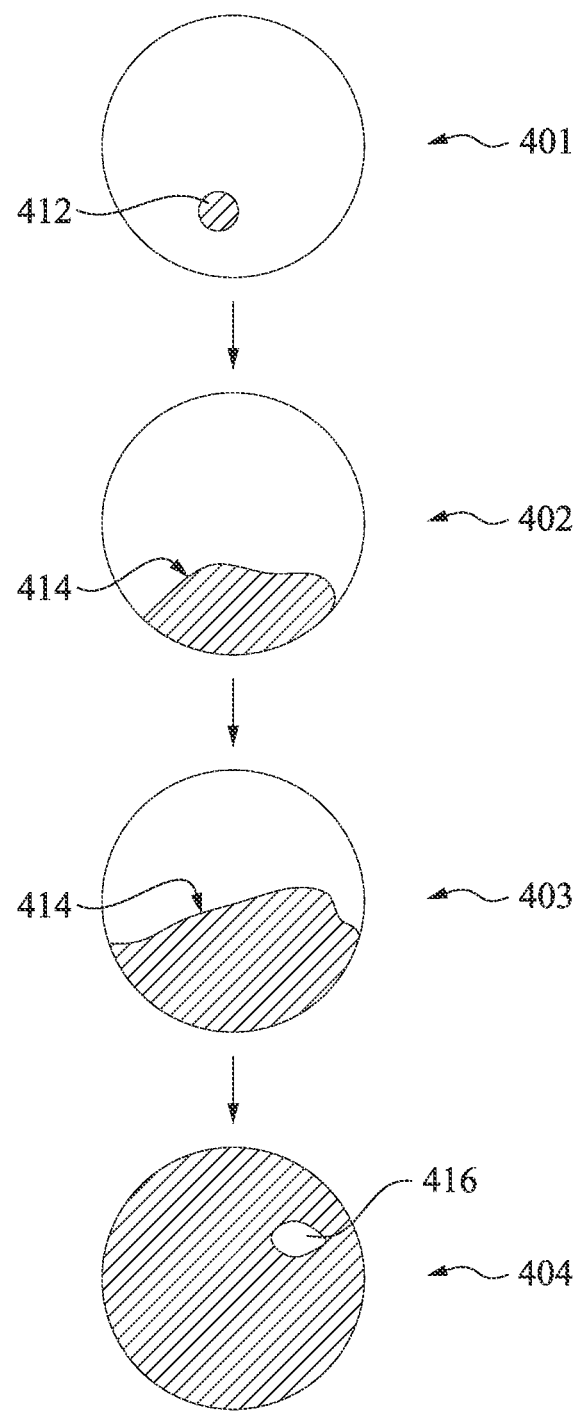
FIG. 4 is a diagram schematically illustrating propagation of a bonding wave during bonding of semiconductor wafers, in accordance with some embodiments.

FIG. 4 schematically illustrates propagation of a bonding wave during bonding of first and second semiconductor wafers, for example, by the wafer bonding apparatus 100. As shown at 401, bonding begins at a bond start point 412, which may be a point at which the first and second semiconductor wafers 22, 24 first contact one another and form a bond between each other. The bond start point 412 may occur at various positions of the first and second semiconductor wafers 22, 24, depending upon a variety of factors, such as warpage of one or both of the semiconductor wafers 22, 24, the structure of the semiconductor wafers 22, 24 (e.g., dummy or patterned), or various other factors.

At 402, the bond wave 414 expands outwardly from the start point 412. The bond wave 414 may expand outwardly in all directions from the start point 412 so that the bonded region between the first and second semiconductor wafers 22, 24 grows as the bonding continues. When the bond wave 414 reaches an edge of the semiconductor wafers 22, 24, the bond wave 414 may continue to expand about the edge of the wafers.

At 403, the bond wave 414 continues expanding across the first and second semiconductor wafers 22, 24. At 404, the bond wave 414 reaches all edges of the first and second semiconductor wafers 22, 24. However, one or more unbonded regions 416 may exist after the bonding process is completed. The unbonded region 416 represents a region at the interface of the first and second semiconductor wafers 22, 24 where the wafers did not properly bond to one another. The unbonded region 416 may be caused by any of a variety of factors, including, for example, wafer warpage so that the wafers do not properly contact one another during bonding, the presence of particles or other contaminants at the surface of one of the wafers that prevents the wafers from fully bonding, conditions in the bonding chamber during bonding (e.g., the bonding pressure applied to bond the wafers together being too high or too low), non-uniform film deposition on the bonding surface of one of the wafers, or the like.

The wafer bonding apparatus 100 may be used to monitor the propagation of the bond wave 414 while the first and second semiconductor wafers 22, 24 are bonded to one another. For example, by irradiating the first and second semiconductor wafers 22, 24 with light (e.g., IR light) emitted by the one or more light sources 16a, 16b and imaging the bonding interface between the first and second semiconductor wafers 22, 24 by the one or more cameras 18a, 18b (e.g., video cameras), the bond wave 414 may be monitored from the initial or start point at which the wafers first contact one another and begin to bond until the bonding process is completed. The video information acquired by the cameras 18a, 18b indicate bonding quality based on a brightness of the infrared (IR) light that is emitted by the light sources 16a, 16b and detected by the cameras 18a, 18b. For example, the acquired video data may indicate bonded regions as regions at which the IR light is brighter in the acquired video data, while unbonded regions or bonding defects may be indicated by darker regions in the video data.

Figure 5:
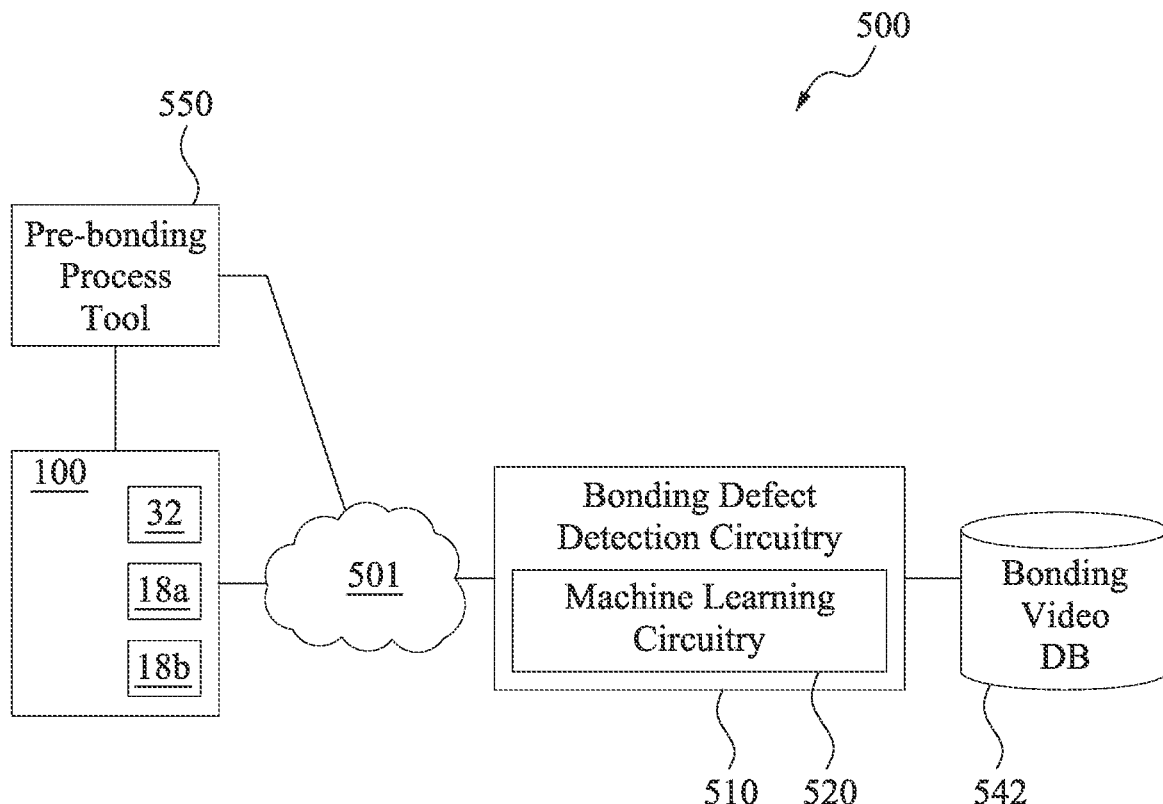
FIG. 5 is a block diagram schematically illustrating a wafer bonding monitoring system, in accordance with some embodiments.

FIG. 5 is a block diagram schematically illustrating a wafer bonding monitoring system 500, in accordance with one or more embodiments. The wafer bonding monitoring system 500 may be used in conjunction with, and may include one or more of the features and functionality of, the wafer bonding apparatus 100 shown in FIG. 1. For example, the wafer bonding monitoring system 500 may include the wafer bonding apparatus 100, including the cameras 18a, 18b and the controller 32. However, embodiments provided by the present disclosure are not limited thereto.

The cameras 18a, 18b acquire video data associated with bonding of the first and second semiconductor wafers 22, 24 during bonding in the wafer bonding apparatus 100. The cameras 18a, 18b are communicatively coupled to bonding defect recognition circuitry 510 so that the bonding defect detection circuitry 510 receives video data associated with wafers being bonded that is output by the cameras 18a, 18b. In some embodiments, the video data that is acquired by the cameras 18a, 18b is provided in real-time to the bonding defect detection circuitry 510 so that the bonding defect detection circuitry 510 may detect or determine the presence of defects in the bonding of the first and second semiconductor wafers 22, 24 in real-time while the bonding occurs. In some embodiments, the bonding defect detection circuitry 510 may detect or determine the presence of defects in the bonding of the first and second semiconductor wafers 22, 24 within 2 seconds of a time the video data is acquired by the cameras 18a, 18b. In some embodiments, the bonding defect detection circuitry 510 may detect or determine the presence of defects in the bonding of the first and second semiconductor wafers 22, 24 within 1 second or less of a time the video data is acquired by the cameras 18a, 18b.

The cameras 18a, 18b may be communicatively coupled to the bonding defect detection circuitry 510 by any suitable communications network 501. The communications network 501 may utilize one or more protocols to communicate via one or more physical networks, including local area networks, wireless networks, dedicated lines, intranets, the Internet, and the like.

In some embodiments, the communications network 501 includes one or more electrical wires which communicatively couple the cameras 18a, 18b to the bonding defect detection circuitry 510. In some embodiments, the communications network 501 may include a wireless communications network for communicating signals from the cameras 18a, 18b to the bonding defect detection circuitry 510. In some embodiments, the bonding defect detection circuitry 510 may be included as part of the controller 32, such as part of the processor 34, of the wafer bonding apparatus 100 shown in FIG. 1.

The bonding defect detection circuitry 510 may be or include any electrical circuitry configured to perform the bonding defect detection techniques described herein. In some embodiments, the bonding defect detection circuitry 510 may include or be executed by a computer processor, a microprocessor, a microcontroller, or the like, configured to perform the various functions and operations described herein with respect to the bonding defect detection circuitry 510. For example, the bonding defect detection circuitry 510 may be executed by a computer processor selectively activated or reconfigured by a stored computer program, or may be a specially constructed computing platform for carrying out the features and operations described herein. In some embodiments, the bonding defect detection circuitry 510 may be configured to execute software instructions stored in any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

The bonding defect detection circuitry 510 may receive images (e.g., video data, which may represent a sequence of acquired images in video form) from the cameras 18a, 18b of semiconductor wafers that are undergoing bonding by the wafer bonding apparatus 100. The bonding defect detection circuitry 510 analyzes the video data to detect or determine the presence of defects in the bonding of the semiconductor wafers, for example, based on a comparison of the received video data of the wafer bonding with past data or analysis of the received video data by a machine learning model that is trained with past data (e.g., past video image data of bonding of semiconductor wafers in which the bonding is determined to have one or more defects) indicative of defects.

In some embodiments, the bonding defect detection circuitry 510 may detect or determine the presence of defects in a wafer bond by employing one or more artificial intelligence or machine learning techniques, which in some embodiments may be implemented at least in part by machine learning circuitry 520. Some or all of the detections or determinations described herein that are made by the bonding defect detection circuitry 510 may be performed automatically by the bonding defect detection circuitry 510, for example, in response to receiving video data of a wafer bond between semiconductor wafers that is being monitored by the cameras 18a, 18b. The machine learning circuitry 520 may be included as part of the bonding defect detection circuitry 510 (as shown), or may be remotely located and communicatively coupled to the bonding defect detection circuitry 510. The machine learning circuitry 520 may detect or determine the presence of defects in wafer bond by using past data (e.g., the machine learning circuitry 520 may be trained based on past data) indicative of defects in wafer bonding between semiconductor wafers, and the machine learning circuitry 520 may compare the received video data with the past data to detect or determine the presence of defects in a wafer bond based on similarities or deviations from the past data or from a trained model contained within, managed by, or otherwise accessible to the machine learning circuitry 520.

"Artificial intelligence" is used herein to broadly describe any computationally intelligent systems and methods that can learn knowledge (e.g., based on training data), and use such learned knowledge to adapt its approaches for solving one or more problems, for example, by making inferences based on a received input, such as the received video data or video images of semiconductor wafer bonding. Machine learning generally refers to a sub-field or category of artificial intelligence, and is used herein to broadly describe any algorithms, mathematical models, statistical models, or the like that are implemented in one or more computer systems or circuitry, such as processing circuitry, and which build one or more models based on sample data (or training data) in order to make predictions or decisions.

The bonding defect detection circuitry 510 or the machine learning circuitry 520 may employ, for example, neural network, deep learning, convolutional neural network, Bayesian program learning, support vector machines, computer vision, and pattern recognition techniques to solve problems such as predicting or determining the presence of defects in semiconductor structure samples. Further, the bonding defect detection circuitry 510 or the machine learning circuitry 520 may implement any one or combination of the following computational algorithms or techniques: classification, regression, supervised learning, unsupervised learning, feature learning, clustering, decision trees, image recognition, or the like.

As one example, an artificial neural network may be utilized by the bonding defect detection circuitry 510 or the machine learning circuitry 520 to develop, train, or update one or more machine learning models which may be utilized to detect or determine the presence of defects in wafer bonds. An example artificial neural network may include a plurality of interconnected "neurons" which exchange information between each other. The connections have numeric weights that can be tuned based on experience, and thus neural networks are adaptive to inputs and are capable of learning. The "neurons" may be included in a plurality of separate layers which are connected to one another, such as an input layer, a hidden layer, and an output layer. The neural network may be trained by providing training data (e.g., past data or past images which are indicative of defects in semiconductor wafer bonds) to the input layer. Through training, the neural network may generate and/or modify the hidden layer, which represents weighted connections mapping the training data provided at the input layer to known output information at the output layer (e.g., classification of received video data as having one or more defects, defective conditions, or the like). Relationships between neurons of the input layer, hidden layer, and output layer, formed through the training process and which may include weight connection relationships, may be stored, for example, as one or more machine learning models within or otherwise accessible to the machine learning circuitry 520.

Once the neural network has been sufficiently trained, the neural network may be provided with non-training data (e.g., new video data or video images of wafer bonds formed between semiconductor wafers during operation of the wafer bonding apparatus 100) at the input layer. Utilizing bonding defect knowledge (e.g., as stored in the machine learning model, and which may include, for example, weighted connection information between neurons of the neural network), the neural network may make determinations about the received images at the output layer. For example, the neural network may detect or determine the presence of defects in the bonding between semiconductor wafers during performed of wafer bonding by the wafer bonding apparatus 100.

Employing one or more computationally intelligent and/or machine learning techniques, the bonding defect detection circuitry 510 may learn (e.g., by developing and/or updating a machine learning algorithm or model based on training data) to detect or determine the presence of defects in bonding of semiconductor wafers based at least in part on knowledge, inferences or the like developed or otherwise learned through training of the machine learning circuitry 520.

The machine learning circuitry 520 may be implemented in one or more processors having access to instructions, which may be stored in any computer-readable storage medium, which may be executed by the machine learning circuitry 520 to perform any of the operations or functions described herein.

In some embodiments, the machine learning circuitry 520 is communicatively coupled to a bonding video database 542, which may be stored, for example, in any computer-readable storage medium. The bonding video database 542 may include video information associated with past wafer bonding processes. For example, the bonding video database 542 may store a plurality of video clips of bonding processes which have previously been performed to bond two wafers together. The video clips stored in the bonding video database 542 may be utilized to compare with current video data (e.g., real-time video data of a current bonding process of two wafers) to determine whether the current bonding process is normal or abnormal, and to detect or determine the presence of bonding defects in the bonding of the wafers. The video clips stored in the bonding video database 542 may be video clips of any temporal length. In some embodiments, the video clips may include video clips of past bonding processes having a length of more than 1 minute.

For example, the video clips stored in the bonding video database 542 may include video clips of entire wafer bonding processes between semiconductor wafers. In some embodiments, the video clips stored in the bonding video database 542 may include video clips of shorter duration than that of an entire wafer bonding process, and may include, for example, video clips having a temporal duration of less than 1 minute, less than 30 seconds, and in some embodiments, less than 5 seconds. Such video clips may be used to train the machine learning circuitry 520 to recognize or detect defects based on short, medium, and long durations of video clips of past data.

In some embodiments, the past video information stored in the bonding video database 542 may be utilized as training data to train the machine learning circuitry 520 or the bonding defect detection circuitry 510. That is, the historical or past video information may be provided as training data for training the machine learning circuitry 520, and the algorithm or machine learning model contained within or accessible to the machine learning circuitry 520 may be updated or modified based on the past video information stored in the bonding video database 542, so that the trained machine learning circuitry 520 may detect or determine the presence of defects in semiconductor wafer bonds, and in some embodiments, may determine whether a current bonding process is normal or abnormal.

In some embodiments, the training data (e.g., the past video information stored in the bonding video database 542) may be labeled training data from which the machine learning circuitry 520 and/or the bonding defect prediction circuitry 510 may learn to detect or determine the presence of bonding defects during the bonding process, and in some embodiments, to determine an action to take in response to the detection of a bonding defect. The labeled training data may indicate, for example, that a particular video clip in the wafer bonding video data represents the presence of a bonding defect, and in some embodiments, labeled training data may indicate a normal bonding process. Training may be based on a wide variety of learning algorithms or models, including, for example, support vector machines, linear regression, logistic regression, naive Bayes, linear discriminant analysis, decision trees, k-nearest neighbor, neural networks, or the like.

The training data (e.g., the past video information stored in the bonding video database 542) may include video information associated with a variety of different types of bonding defects. For example, the video information may include video information associated with bonding defects due to the position of a bonding start point, as certain bonding processes may normally start at a particular position (e.g., near a lower point or an outer region of the wafers being bonded). Abnormal or defective bonding processes may be indicated by video data in which the bonding start point occurs at a position that is different from a normal bonding start point. Further, the video information may include video information associated with bonding defects due to multiple bond start points occurring concurrently, such as when bonding begins at two different points at the interface between the two wafers being bonded. This may be indicative of a bonding defect in certain bonding processes. Moreover, the video information may include video information associated with defects due to the presence of particles on one of the wafers, defects due to a non-uniform bonding wave propagation speed, defects due to a void in the bonding between two wafers, defects due to a defective pre-treatment or pre-clean process, or any other defects due to any other cause.

The bonding wave propagation speed may be related to the strength of the wafer bond, and thus the bonding wave propagation speed may indicate the presence of bonding defects, e.g., bonding defects due to a low strength wafer bond. In some embodiments, the bond wave propagation speed may be non-uniform as the bond wave propagates across the surfaces (e.g., the bonding interface) of the semiconductor wafers undergoing the bonding. This non-uniform speed may be due to various defects of the wavers, such as an irregular topography of the wafers (e.g., due to non-uniform film deposition, or the like), wafer warpage, or the like. Accordingly, the non-uniform speed of the bond wave propagation may be utilized to indicate the presence of a bonding defect. Moreover, bonding defects may be indicated by the presence of a bond void (e.g., an unbonded area), which may be regions at which bonding between the two semiconductor wafers is incomplete or very weak. The training data, e.g., the past video information associated with bonding defects, may include data associated with a variety of different semiconductor wafers having a variety of different layout patterns, die counts, interface materials, pre-treatment layers or processes that are performed, or the like. Different types of the semiconductor wafers undergoing bonding may have different bonding parameters, e.g., wafers having different layout patterns, die counts, interface materials, pre-treatment layers, or the like may have different bond wave propagation speeds, bond wave start points, or the like. As such, training data provided for a variety of different cases may be utilized to indicate the presence of bonding defects.

In some embodiments, the machine learning circuitry 520 implements a pattern recognition algorithm to determine, in real time, whether a monitored wafer bonding process is normal or abnormal, and in some embodiments, the machine learning circuitry 520 may determine an action to take in response to the bonding process being determined to be abnormal. In some embodiments, the machine learning circuitry 520 or the bonding defect detection circuitry 510 may implement one or more machine learning or artificial intelligence techniques (e.g., by the machine learning circuitry 520) to determine whether a monitored wafer bonding process is normal or abnormal, and an action to take in response to the bonding process being determined to be abnormal.

The machine learning circuitry 520 or the bonding defect detection circuitry 510 may be trained to recognize a plurality of different types of bonding defects. For example, some bonding defects may be determined based on a speed of propagation of a bonding wave during the bonding process. For example, if the bonding wave propagates too fast, this may result in a poor quality bonding between two wafers. Thus, past video information of bonding wave propagations having a plurality of different speeds (some of which may be labeled normal, others abnormal) may be utilized as training data for training the machine learning circuitry 520 or bonding defect detection circuitry 510, and may be stored in the bonding video database 542. Additional types of defects may be detected, for example, defects due to the presence of particles on one of the wafers, defects due to a non-uniform bonding wave propagation speed, defects due to a void in the bonding between two wafers, defects due to a defective pre-treatment or pre-clean process, or any other defects due to any other cause. A variety of past video information indicative of a variety of different types of defects and their causes may be stored in the bonding video database 542 and used as training data. Accordingly, the machine learning circuitry 520 or the bonding defect detection circuitry 510 may learn to detect or recognize (e.g., through implementing video pattern recognition algorithms) the presence or absence of bonding defects, in real-time, while a bonding process is performed to bond two wafers to one another.

Additionally, in some embodiments, the machine learning circuitry 520 or the bonding defect detection circuitry 510 may be trained to detect or recognize defects in bonding processes performed between wafers having a plurality of different types of bonding interfaces (e.g., materials at the bonding surface between two wafers being bonded to one another). For example, the machine learning circuitry 520 or the bonding defect detection circuitry 510 may be trained based on past video information representing bonding defects (or absence thereof) during bonding processes of wafers having as a bonding surface any of: a thermal oxidation layer, a poly-silicon layer, silicon nitride, silicon oxide, or any other material.

The past video information used for training the machine learning circuitry 520 or the bonding defect detection circuitry 510 may include video information representing bonding between semiconductor wafers which are both patterned wafers, both unpatterned wafers (e.g., dummy wafers), or one patterned wafer and one unpatterned wafer, for example, as shown and described with respect to FIGS. 3A to 3C. Thus, in some embodiments, the machine learning circuitry 520 or the bonding defect detection circuitry 510 may be trained to recognize defects in bonding processes performed between wafers of a plurality of different types. For example, the past video information may include past video information representing bonding defects (or absence thereof) during bonding between two unpatterned or dummy wafers, between a dummy wafer and a patterned wafer, or between two patterned wafers.

Further, the past video information used for training may include video information representing bonding defects (or absence thereof) during bonding processes of wafers which were subjected to a variety of different pre-treatment processes (e.g., Ar plasma, etc.), pre-clean processes (e.g., water clean, etc.), or any other pre-bonding stage processes.

In various embodiments, the past video information used for training the machine learning circuitry 520 or the bonding defect detection circuitry 510 may include 3-dimensional (3D) video data, such as 3D video data that is acquired by two or more video cameras in order to construct the 3D video data.

In some embodiments, the machine learning circuitry 520 or the bonding defect detection circuitry 510 may learn to determine an action to be taken in response to determining a defect in the bonding process. Such actions may include, for example, stopping the current bonding process, performing a rework process (e.g., debonding, cleaning, pre-treating, and bonding again) for the wafers, adjusting a wafer bonding parameter (e.g., increase bonding pressure), and adjusting a pre-stage process performed by a pre-bonding process tool 550 (e.g., adjusting parameters of a pre-stage film deposition process, a cleaning process, etc.). The pre-bonding process tool 550 may be any semiconductor processing or manufacturing tool or apparatus that is used to perform one or more processes on semiconductor wafers before the wafers are bonded in the wafer bonding apparatus 100. The pre-bonding process tool 550 may be, in some embodiments, a process tool configured to perform wafer cleaning, pre-treating of wafers prior to bonding (e.g., a plasma pre-treating process), pre-bonding film deposition (e.g., for depositing one or more films on the bonding surface of the wafers, such as a dielectric film like SiN, $SiO_x$, or the like), or any other wafer processing that may be performed prior to bonding of the wafers.

In some embodiments, the machine learning circuitry 520 or the bonding defect detection circuitry 510 may provide or otherwise output an indication of a detected defect during a bonding process which may be utilized to take an action, such as stopping the bonding process, performing a rework process, adjusting parameters, or the like. For example, the machine learning circuitry 520 or the bonding defect detection circuitry 510 may provide a feedback signal, via the communications network 501, to the wafer bonding apparatus 100 (e.g., to the controller 32), and the wafer bonding apparatus 100 may be controlled, e.g., by the controller 32, to automatically stop the bonding process upon receipt of the control signal that indicates the presence of a bonding defect. This allows the defective bonding to immediately be stopped, as opposed to waiting until the wafers are completely bonded to one another, or until an entire lot or series of wafers are bonded.

In some embodiments, the feedback signal may cause the controller 32 to adjust one or more parameters of the wafer bonding apparatus 100, such as to increase or decrease a bonding pressure applied to bond the semiconductor wafers to one another, or to increase or decrease a pressure within the bonding chamber 10.

In some embodiments, a control or feedback signal may be output, for example, to a display of a computer device included in or communicatively coupled to the wafer bonding apparatus 100 so that a user may be informed that a defect is detected and may therefore stop the bonding process or perform another action, such as to control or adjust one or more bonding parameters within the wafer bonding apparatus 100. The control or feedback signal may further be utilized as part of an alarm or alert system which provides a perceptible output to a user in order to notify the user that a defect has been detected during bonding of semiconductor wafers. For example, the perceptible output may be provided in the form of an auditory alarm, a visual alarm (e.g., blinking lights or the like provided on a display of a computer device or on a panel of the wafer bonding apparatus 100), or the like.

In some embodiments, the machine learning circuitry 520 or the bonding defect detection circuitry 510 may automatically control parameters of a separate tool or process (e.g., the pre-bonding process tool 550) in response to determining that a defect is present in the wafer bonding. For example, the machine learning circuitry 520 or the bonding defect detection circuitry 510 may be communicatively coupled to the pre-bonding process tool 550, e.g., via the communications network 501. In such embodiments, the machine learning circuitry 520 or the bonding defect detection circuitry 510 may determine that the type of defect (e.g., multiple bonding starting points) is due to a defect in a pre-treatment or pre-clean process (e.g., pre-layer film process causes abnormal film stress, which causes wafer warpage and thus bonding defect due to multiple bond starting points), and the machine learning circuitry 520 or the bonding defect detection circuitry 510 may automatically adjust one or more parameters of the pre-treatment or pre-clean process to reduce or eliminate future occurrences of the detected type of bonding defect. For example, the machine learning circuitry 520 or the bonding defect detection circuitry 510 may automatically output a feedback signal or a control signal to the pre-bonding process tool 550 that causes the pre-bonding process tool 550 to adjust one or more parameters (e.g., reduce a thickness of a pre-layer film, etc.) of the pre-bonding process in order to reduce or eliminate future occurrences of the bonding defect. In some embodiments, the machine learning circuitry 520 or the bonding defect detection circuitry 510 may provide feedback to pre-bonding process tool 550 (e.g., a pre-treatment or pre-clean process tool) to indicate a suggested adjustment to be made, or to otherwise optimize processes, in response to the detected bonding defect.

Figure 6:
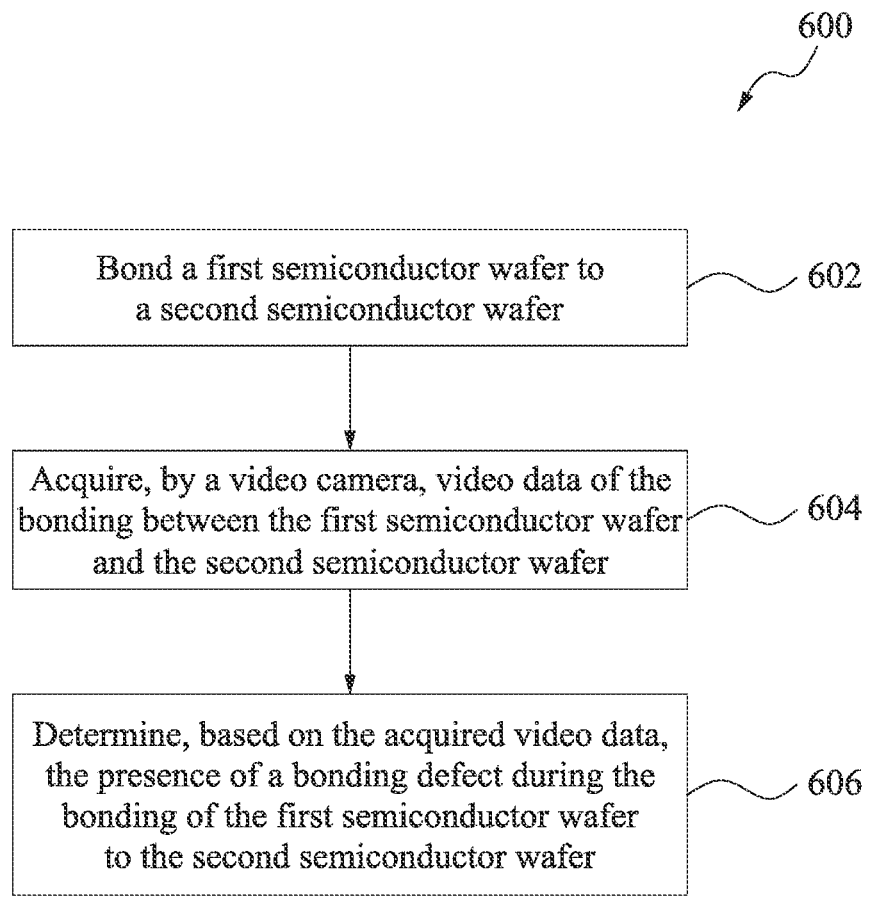
FIG. 6 is a flowchart illustrating a semiconductor wafer bonding defect detection method, in accordance with some embodiments.

FIG. 6 is a flowchart 600 illustrating a semiconductor wafer bonding defect detection method, in accordance with one or more embodiments. The semiconductor wafer bonding defect detection method may be implemented at least in part, for example, by the wafer bonding apparatus 100 shown in and described with respect to FIG. 1 or the wafer bonding monitoring system 500 shown in and described with respect to FIG. 5.

At 602, the method includes bonding a first semiconductor wafer to a second semiconductor wafer. The first and second semiconductor wafers may be bonded to one another in the wafer bonding apparatus 100, for example, within the wafer bonding chamber 10. During the bonding of the first and second semiconductor wafers, various parameters of the wafer bonding chamber 10 may be set as desired, including, for example, a pressure within the wafer bonding chamber 10. Moreover, a bonding pressure may be applied, for example, by the first and second wafer chucks 12, 14, in order to press the first and second semiconductor wafers against one another during the bonding.

At 604, the method includes acquiring, by a video camera 18a, 18b, video data of the bonding between the first and second semiconductor wafers. The video camera may be an infrared (IR) video camera, and in some embodiments, more than one video camera may be utilized to acquire the video data. In some embodiments, the acquired video data may be utilized to construct a 3D representation of the bonding of the semiconductor wafers.

At 606, the method includes determining, based on the acquired video data, the presence of a bonding defect during the bonding of the first semiconductor wafer to the second semiconductor wafer. The defect may be determined, for example, by the wafer bonding defect detection circuitry 510, which, in some embodiments, may include or otherwise implement machine learning circuitry 520 to detect or determine the presence of bonding defects. The determination of the bonding defect may be performed in real-time, for example, while the bonding of the semiconductor wafers is being carried out.

Embodiments of the present disclosure provide several advantages. For example, embodiments provided herein can detect, in real-time, the occurrence of bonding defects during bonding of two semiconductor wafers. This facilitates immediate remediation efforts, such as stopping the bonding process before further damage occurs, reworking the bonded wafers (e.g., debonding, re-cleaning, re-bonding, etc.), and adjusting bonding or other process parameters to avoid bonding defects in future wafer bonding processes. This provides significant cost savings in terms of reduced wafer scrap, increased yield, increased reliability, and other factors. Other advantages are described herein and still others will be apparent in view of the present disclosure.

According to one embodiment, a wafer bonding system includes a camera and wafer bonding defect detection circuitry. The camera is configured to monitor bonding between two semiconductor wafers. The wafer bonding defect detection circuitry, in use, receives video data from the camera, and detects a bonding defect based on the received video data.

According to another embodiment, a method is provided that includes bonding a first semiconductor wafer to a second semiconductor wafer. A video camera acquires video data of the bonding between the first and second semiconductor wafers. Wafer bonding defect detection circuitry determines the presence of a bonding defect during the bonding based on the acquired video data.

According to yet another embodiment, a wafer bonding monitoring system includes a wafer bonding apparatus that includes a wafer bonding chamber, a camera configured to acquire video information during bonding between two semiconductor wafers in the wafer bonding chamber, and a light source configured to emit light toward the two semiconductor wafers during the bonding. The system further includes a wafer bonding video database configured to store past video data associated with a plurality of bonding defects, and bonding defect detection circuitry. The bonding defect detection circuitry is configured to receive the video information from the camera, and detect a bonding defect based on the received video data and the past video data stored in the wafer bonding video database.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
bonding a first semiconductor wafer to a second semiconductor wafer;
during the bonding, emitting infrared light toward a bonding interface between the first semiconductor wafer and the second semiconductor wafer;
receiving, by a video camera video data during the bonding, the video data including infrared light reflected by at least one of the first or the second semiconductor wafer or infrared light transmitted through the first semiconductor wafer and the second semiconductor wafer, the infrared light received by the video camera representing a bonding wave of the bonding between the first semiconductor wafer and the second semiconductor wafer; and
determining during the bonding, by wafer bonding defect detection circuitry, the presence of a bonding defect based on the acquired video data representing a bonding wave of the bonding.

2. The method of claim 1 wherein the determining the presence of a bonding defect includes:
accessing past video data stored in a wafer bonding video database, the past video data associated with bonding waves during bonding between two semiconductor wafers and with a plurality of bonding defects; and
comparing the acquired video data with the past video data.

3. The method of claim 1 wherein the determining the presence of a bonding defect includes determining a defect due to a non-uniform bonding wave propagation speed.

4. The method of claim 1, further comprising:
controlling a bonding pressure applied to bond the first semiconductor wafer to the second semiconductor wafer in response to the determining the presence of a bonding defect.

5. The method of claim 1, further comprising:
controlling a pressure, within a bonding chamber in which the bonding the first semiconductor wafer to the second semiconductor wafer is performed, in response to the determining the presence of a bonding defect.

6. The method of claim 1 wherein the bonding the first semiconductor wafer to the second semiconductor wafer includes at least one of: bonding two unpatterned semiconductor wafers to one another, bonding two patterned semiconductor wafers to one another, or bonding an unpatterned semiconductor wafer to a patterned semiconductor wafer.

7. The method of claim 1, further comprising:
stopping the bonding between the first semiconductor wafer and the second semiconductor wafer in response to the determining the presence of a bonding defect.

8. The method of claim 1, further comprising:
adjusting at least one operational parameter of a pre-bonding process tool in response to the determining the presence of a bonding defect.

9. The method of claim 1, wherein the infrared light received by the video camera is infrared light transmitted through the first semiconductor wafer and transmitted through the second semiconductor wafer.

10. The method of claim 1, wherein the infrared light received by the video camera is reflected by at least one of the first semiconductor wafer or the second semiconductor wafer.

11. A method, comprising:
bonding a first semiconductor wafer to a second semiconductor wafer;
receiving, by a video camera bonding wave video data during the bonding, the bonding wave video data including (1) light reflected by at least one of the first semiconductor wafer or the second semiconductor wafer at a bonding wave or (2) light transmitted through the first semiconductor wafer and the second semiconductor wafer at the bonding wave, the light received by the video camera representing the bonding wave of the bonding between the first semiconductor wafer and the second semiconductor wafer;
during the bonding, monitoring an unbonded region or a defect region between the first semiconductor wafer and the second semiconductor wafer, the monitoring including emitting light toward the unbonded region or the defect region between the first semiconductor wafer and the second semiconductor wafer;
receiving, by a video camera, defect video data during the bonding, the defect video data including (3) light reflected by at least one of the first semiconductor wafer or the second semiconductor wafer at the unbonded region or the defect region or (4) light transmitted through the first semiconductor wafer and the second semiconductor wafer at the unbonded region or the defect region, the light reflected or transmitted at the unbonded region or the defect region received by the video camera representing a bonding state between the first semiconductor wafer and the second semiconductor wafer at the unbonded region or the defect region; and determining, by wafer bonding defect detection circuitry, the presence of a bonding defect during the bonding based on the acquired defect video data.

12. The method of claim 11, wherein the light received by the video camera representing a bonding wave is brighter than the light received by the video camera representing a bonding state between the first semiconductor wafer and the second semiconductor wafer at the unbonded region or the defect region.

13. The method of claim 11, wherein the determining, by the wafer bonding detection circuitry, the presence of a bonding defect during the bonding includes a video pattern recognition process.

14. The method of claim 13, wherein the video pattern recognition process includes the wafer bonding defect detection circuitry detecting the bonding defect based, at least in part, on past video stored in a wafer bonding video database.

15. The method of claim 11, further comprising determining an action to be taken in response to detecting the bonding defect, the action to be taken including at least one of: stopping a current bonding process, performing a rework process on wafers undergoing bonding, adjusting a parameter of the current bonding process, or adjusting a parameter of a pre-bonding process.

16. A method, comprising:
   initiating, at a bond start point, bonding between a first semiconductor wafer and a second semiconductor wafer;
   expanding the bonding between the first semiconductor wafer and the second semiconductor wafer along a bond wave;
   during the bonding, emitting infrared light toward a bonding interface between the first semiconductor wafer and the second semiconductor wafer;
   receiving, by a video camera video data during the bonding, the video data including infrared light reflected by at least one of the first semiconductor wafer or the second semiconductor wafer or infrared light transmitted through the first semiconductor wafer and the second semiconductor wafer, the infrared light received by the video camera representing a bonding wave of the bonding between the first and second semiconductor wafers; and
   determining, by wafer bonding defect detection circuitry, the presence of a bonding defect during the bonding based on the acquired video data representing the bonding wave of the bonding.

17. The method of claim 16, wherein the determining, by the wafer bonding defect detection circuitry, the presence of a bonding defect during the bonding further includes a video pattern recognition process.

18. The method of claim 17, wherein the video pattern recognition process includes the wafer bonding defect detection circuitry detecting the bonding defect based, at least in part, on past video stored in a wafer bonding video database.

19. The method of claim 16, further comprising determining an action to be taken in response to detecting the bonding defect, the action to be taken including at least one of: stopping a current bonding process, performing a rework process on wafers undergoing bonding, adjusting a parameter of the current bonding process, or adjusting a parameter of a pre-bonding process.

20. The method of claim 16, further including transmitting the infrared light through a chuck supporting the first semiconductor wafer or the second semiconductor wafer.

* * * * *